United States Patent
Chen et al.

(10) Patent No.: US 10,867,962 B2
(45) Date of Patent: Dec. 15, 2020

(54) PACKAGING PROCESS AND MANUFACTURING METHOD

(71) Applicant: Taiwan Semiconductor Manufacturing Co., Ltd., Hsinchu (TW)

(72) Inventors: Jiun-Ting Chen, Hsinchu (TW); Chih-Wei Wu, Yilan County (TW); Szu-Wei Lu, Hsinchu (TW); Ying-Ching Shih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/151,340

(22) Filed: Oct. 4, 2018

(65) Prior Publication Data
US 2020/0006286 A1 Jan. 2, 2020

Related U.S. Application Data

(60) Provisional application No. 62/691,625, filed on Jun. 29, 2018.

(51) Int. Cl.
| | |
|---|---|
| *H01L 23/00* | (2006.01) |
| *H01L 25/065* | (2006.01) |
| *H01L 25/18* | (2006.01) |
| *H01L 25/00* | (2006.01) |
| *H01L 23/538* | (2006.01) |
| *H01L 21/66* | (2006.01) |
| *H01L 21/683* | (2006.01) |
| *H01L 21/48* | (2006.01) |

(52) U.S. Cl.
CPC ............ *H01L 24/97* (2013.01); *H01L 21/486* (2013.01); *H01L 21/6835* (2013.01); *H01L 22/12* (2013.01); *H01L 23/5384* (2013.01); *H01L 25/0655* (2013.01); *H01L 25/18* (2013.01); *H01L 25/50* (2013.01); *H01L 2221/68372* (2013.01); *H01L 2224/95001* (2013.01); *H01L 2924/1431* (2013.01); *H01L 2924/1434* (2013.01); *H01L 2924/3511* (2013.01)

(58) Field of Classification Search
None
See application file for complete search history.

(56) References Cited

U.S. PATENT DOCUMENTS

| | | |
|---|---|---|
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |

(Continued)

*Primary Examiner* — Alexander G Ghyka
(74) *Attorney, Agent, or Firm* — JCIPRNET

(57) ABSTRACT

A manufacturing method and a packaging process are provided. A package having a first die and a second die is provided. A circuit substrate having a first warpage level is provided. The package is mounted onto the circuit substrate and then heated under an elevated temperature to bond the package to the circuit substrate. The package heated under the elevated temperature is warped with a second warpage level, and the first warpage level is substantially in conformity with the second warpage level.

20 Claims, 15 Drawing Sheets

(56) References Cited

U.S. PATENT DOCUMENTS

| | | | |
|---|---|---|---|
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2011/0215457 A1* | 9/2011 | Park | H01L 23/3677 257/686 |
| 2015/0130072 A1* | 5/2015 | Wu | H01L 23/481 257/774 |

* cited by examiner

PACKAGING PROCESS AND MANUFACTURING METHOD

CROSS-REFERENCE TO RELATED APPLICATION

This application claims the priority benefits of U.S. provisional application Ser. No. 62/691,625, filed on Jun. 29, 2018. The entirety of the above-mentioned patent application is hereby incorporated by reference herein and made a part of this specification.

BACKGROUND

In advanced assembly design, the semiconductor packages and the multi-chip packages are further connected with circuit substrates through surface mounting technology or flip bonding technology. As the packages are surface mounted to the substrate through conductive bumps or balls, the reliability of the joint connection is crucial.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
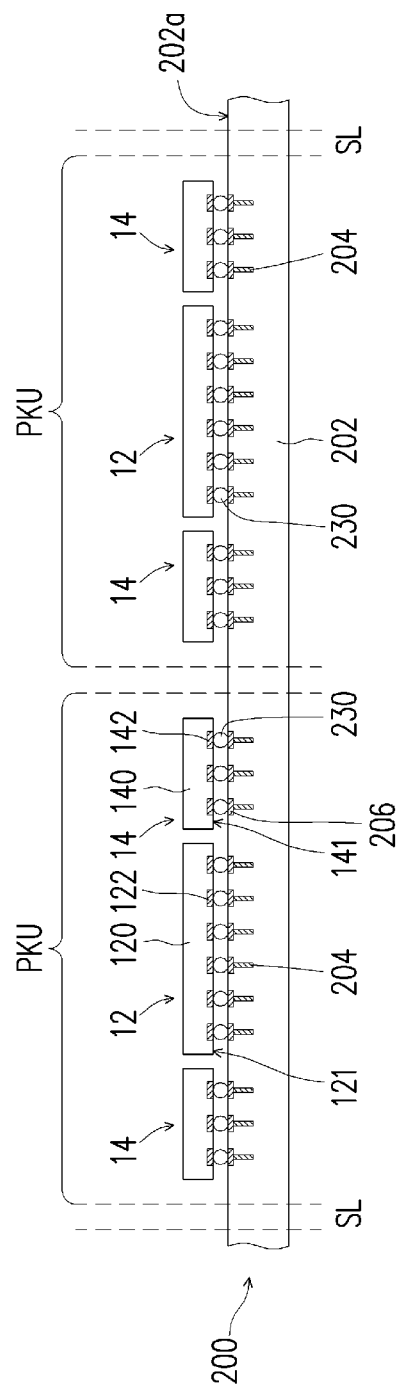
FIG. 1 to FIG. 10 are schematic cross-sectional views of various stages in a manufacturing method of a package structure according to some exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

For the embodiments provided herein, the technology may be discussed in a specific context, namely, arranging spacers underneath a packaging substrate or circuit substrate during the heating process for bonding a package structure with the packaging substrate or circuit substrate. Through the arrangement and layout design of the spacers, the circuit substrate is bowed, arched or curved with one or more curvatures corresponding to the warpage of the package structure during the heating process. This enables a more reliable package structure by reducing the likelihood of cold joints or bump bridging between the package(s) and the circuit substrate or packaging substrate. In some embodiments, the spacer(s) may be positioned in the regions below the major chip(s) packed within the package structure. In some embodiments, the spacer(s) may be positioned in the regions below the tributary chip(s) packed within the package structure. The spacer(s) may allow better control of the joint bonding between the package(s) and the circuit substrate and superior reliability of the bonded joints. The spacer(s) may control the warpage level of the circuit substrate matching with the warpage level of the package structure, thus reducing the impact caused by warpage from the coefficient of thermal expansion (CTE) mismatch. In some embodiments, the active dies are stacks of one or more dies (e.g. logic die stacks or memory die stacks). In these embodiments, the material(s), the amount, the size and/or the position of the spacer may be not limited to the descriptions provided in the embodiments as long as the spacer(s) can provide the spacing and support for the packaging substrate or circuit substrate.

Packaging processes may include forming multi-chip package structures using Chip-on-Wafer-on-Substrate (CoWoS) packaging processing. Other embodiments may also other processing, including integrated fan-out (InFO) packaging processing. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIG. 1 to FIG. 10 are schematic cross-sectional views of various stages in a manufacturing method of a package structure according to some exemplary embodiments of the disclosure.

In FIG. 1, an interposer 200 is provided. In some embodiments, the interposer 200 includes a substrate 202, through vias 204 and conductive pads 206 therein. In some embodiments, the substrate 202 may comprise a bulk semiconductor substrate, SOI substrate or a multi-layered semiconductor material substrate. The semiconductor material of the substrate 202 may be silicon, germanium, silicon germanium, silicon carbide, gallium arsenic, gallium phosphide, indium phosphide, indium arsenide, indium antimonide, GaAsP, AlInAs, AlGaAs, GaInAs, GaInP, GaInAsP, or combinations thereof. In some embodiments, the substrate 202 may be doped or undoped. In some embodiments, the conductive pads 206 are formed on a first surface 202a of the interposer 200. In some embodiments, through vias 204 are formed in the substrate 202 and connected with the conductive pads 206. In some embodiments, the through vias 204 extend into the substrate 202 with a specific depth. In some embodiments, the through vias 204 are through-substrate vias. In some embodiments, the through vias 204 are through-silicon vias when the substrate 202 is a silicon substrate. In some embodiments, the through vias 204 may be formed by forming holes or recesses in the substrate 202 and then filling the recesses with a conductive material. In some embodiments, the recesses may be formed by, for example, etching, milling, laser drilling or the like. In some embodiments, the conductive material may be formed by an electro-chemical plating process, CVD, ALD or PVD, and the conductive material may include copper, tungsten, aluminum, silver, gold or a combination thereof. In some embodiments, the conductive pads 206 connected with the through vias 204 may be formed as conductive parts of the redistribution layer(s) formed on the interposer 200. In some embodiments, the conductive pads 206 include under bump metallurgies (UBMs).

In certain embodiments, the interposer 200 may further include active or passive devices, such as transistors, capacitors, resistors, or diodes passive devices formed in the substrate 202.

In FIG. 1, first dies 12 and second dies 14 are provided. In some embodiments, the first and second dies 12, 14 are individual dies singulated from a wafer. In some embodiments, the first dies 12 contain the same circuitry, such as devices and metallization patterns, or the first dies 12 are the same type of dies. In some embodiments, the second dies 14 contain the same circuitry, or the second dies 14 are the same type of dies. In certain embodiments, the first die 12 and the second die 14 have different circuitry or are different types of dies. In alternative embodiments, the first die 102 and the second die 104 may have the same circuitry.

In some embodiments, the first dies 12 may be major dies, while the second dies 14 are tributary dies. Viewing from packaging units PKU defined between the scribe lanes (SL), the major dies are arranged on the interposer 200 in central locations of the packaging units PKU, while the tributary dies are arranged side-by-side and spaced apart from the major dies. In some embodiments, the tributary dies are arranged aside the major dies, and around or surrounding the major dies. In one embodiment, four or six tributary dies are arranged around one major die per one packaging unit PKU. In certain embodiments, the first die 12 has a surface area larger than that of the second die 14. Also, in some embodiments, the first die 12 and the second die 14 may be of different sizes, including different surface areas and/or different thicknesses. In some embodiments, the first die 12 may be a logic die, including a central processing unit (CPU) die, graphics processing unit (GPU) die, system-on-a-chip (SoC) die, a microcontroller or the like. In some embodiments, the first die 12 is a power management die, such as a power management integrated circuit (PMIC) die. In some embodiments, the second die 14 may be a memory die, including dynamic random access memory (DRAM) die, static random access memory (SRAM) die or a high bandwidth memory (HBM) die. In some embodiments, the first die 12 include a body 120 and connecting pads 122 formed on an active surface 121 of the body 120. In certain embodiments, the connecting pads 122 may further include pillar structures for bonding the dies 12 to other structures. In some embodiments, the second die 14 include a body 140 and connecting pads 142 formed on an active surface 141 of the body 140. In other embodiments, the connecting pads 142 may further include pillar structures for bonding the dies 14 to other structures.

In FIG. 1, the first dies 12 and the second dies 14 are attached to the first surface 202a of the interposer 200, for example, through flip-chip bonding by way of the conductive joints 230. Through the reflow process, conductive joints 230 are formed between the connecting pads 122, 142 and conductive pads 206, electrically and physically connecting the dies 12, 14 and the interposer 200. In certain embodiments, the conductive joints 230 are micro-bumps, such as micro-bumps having copper metal pillars. In another embodiment, the conductive joints 230 are solder bumps, lead-free solder bumps, or micro bumps, such as controlled collapse chip connection (C4) bumps or micro bumps containing copper pillars. The conductive joints 230 electrically connect the first dies 12 and the second dies 14, through the connecting pads 122, 142 and conductive pads 206, with the through vias 204 of the interposer 200.

In some embodiments, the bonding between the dies 12, 14 and the interposer 200 may be solder bonding. In some embodiments, the bonding between the dies 12, 14 and the interposer 200 may be direct metal-to-metal bonding, such as copper-to-copper bonding. In some embodiments, an underfill material (not shown) may be dispensed into the gaps between the dies 14, 14 and the interposer 200 surrounding the conductive joints 230.

Figure 2:
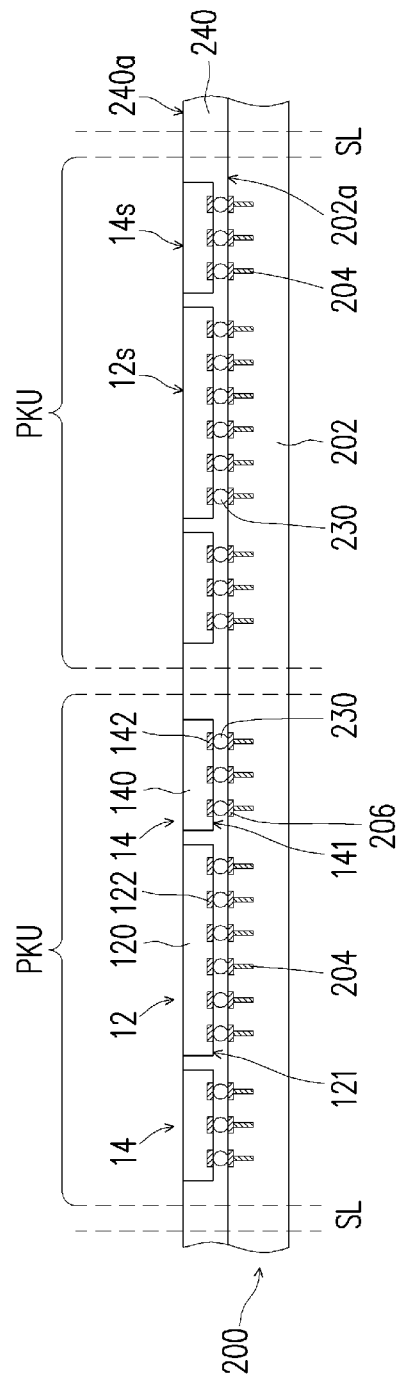

In FIG. 2, an encapsulant 240 is formed over the interposer 200 covering the first and second dies 12, 14 and the conductive joints 230. In some embodiments, the encapsulant 240 may be a molding compound. In some embodiments, the encapsulant 240 includes epoxy resin(s) and may be formed by compression molding or transfer molding. In one embodiment, a curing process is performed to cure the encapsulant 240. In some embodiments, the first and second dies 12, 14 and the conductive joints 230 are encapsulated by the encapsulant 240. In some embodiments, a planarization process, including grinding or polishing, may be performed to partially remove the encapsulant 240, exposing backside surfaces 12S, 14S of the first and second dies 12, 14. Accordingly, the backside surfaces 12S, 14S of the first and second dies 12, 14 are leveled with a top surface 240a of the encapsulant 240.

Figure 3:
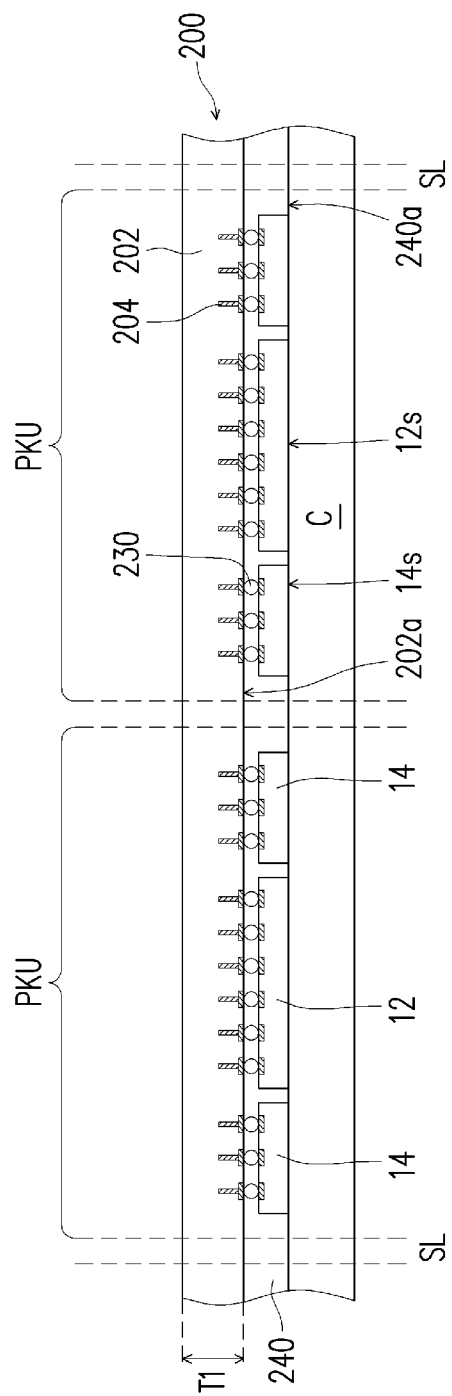

In FIG. 3, the structure of FIG. 2 is turned upside down or flipped, and placed on a carrier C, so that the carrier C directly contacts the backside surfaces 12S, 14S of the first and second dies 12, 14 and the top surface 240a of the encapsulant 240. As shown in FIG. 3, at this stage of processing, the interposer 200 has not been thinned and has a thickness T1.

Figure 4:
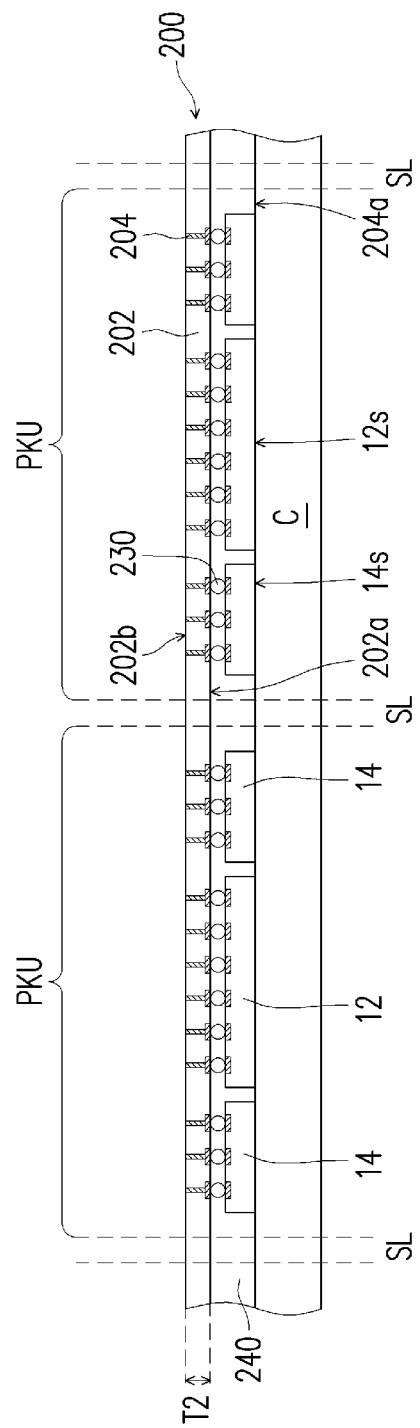

In FIG. 4, a thinning process is performed to the interposer 200 to partially remove or thin the substrate 202 of the interposer 200 until the through vias 204 are exposed and a second surface 202b of the interposer is formed. In some embodiments, the thinning process may include a back grinding process, a polishing process or an etching process. In some embodiments, after the thinning process, the interposer 200 is thinned to a thickness T2. In some embodiments, a ratio of the thickness T2 to the thickness T1 ranges from about 0.1 to about 0.5.

Figure 5:
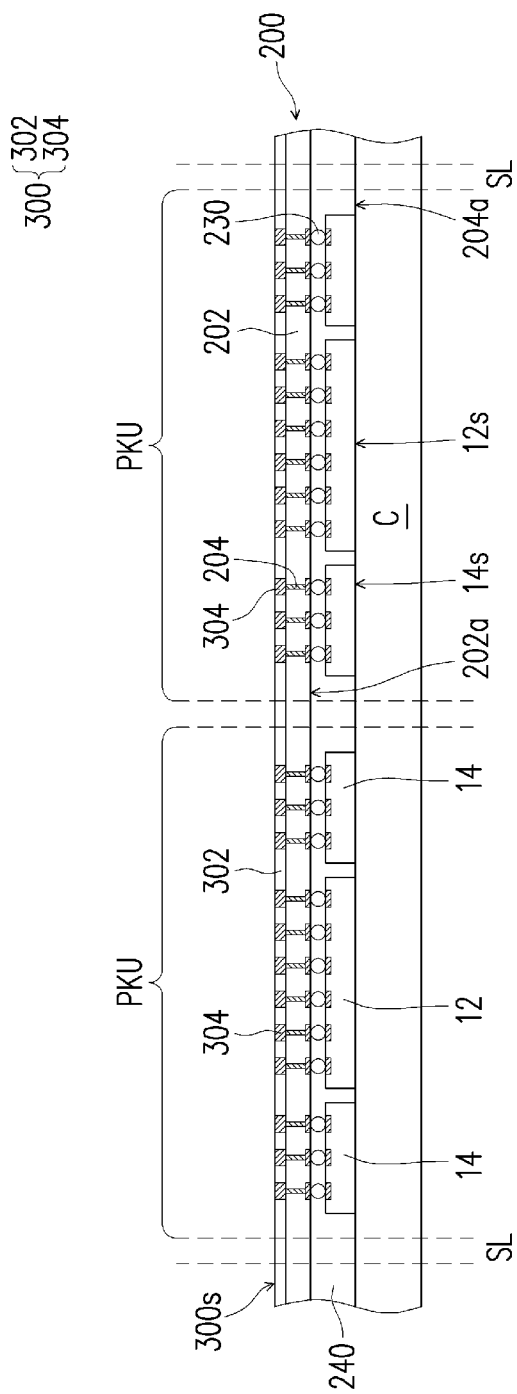

In FIG. 5, a redistribution structure 300 is formed on the second surface 202b of the substrate 202 (the interposer 200). In some embodiments, the redistribution structure 300 electrically connects the through vias 204 and/or electrically connects the through vias 204 with external devices. In certain embodiments, the redistribution structure 300 includes at least one dielectric layer 302 and metallization patterns 304 in the dielectric layer 302. In some embodiments, the metallization patterns 304 may comprise pads, vias and/or trace lines to interconnect the through vias 204 and to further connect the through vias 204 to one or more external devices. Although one layer of dielectric layer is shown in FIG. 5 and the following figures more than one dielectric layer may be included within the redistribution structure. In some embodiments, the material of the dielectric layer 302 comprises silicon oxide, silicon nitride, silicon carbide, silicon oxynitride, or low-K dielectric materials (such as phosphosilicate glass materials, fluorosilicate glass materials, boro-phosphosilicate glass materials, SiOC, spin-on-glass materials, spin-on-polymers or silicon carbon materials). In some embodiments, the dielectric layer 302 may be formed by spin-coating or deposition, including chemical vapor deposition (CVD), PECVD, HDP-CVD, or the like. In some embodiments, the metallization patterns 304 include under-metal metallurgies (UBMs). In some embodiments, the formation of the metallization patterns 304 may include patterning the dielectric layer using photolithography techniques and one or more etching processes and filling a metallic material into the openings of the patterned dielectric layer. Any excessive conductive material on the dielectric layer may be removed, such as by using a chemical mechanical polishing process. In some embodiments, the material of the metallization patterns 304 includes copper, aluminum, tungsten, silver, and combinations thereof.

Figure 6:
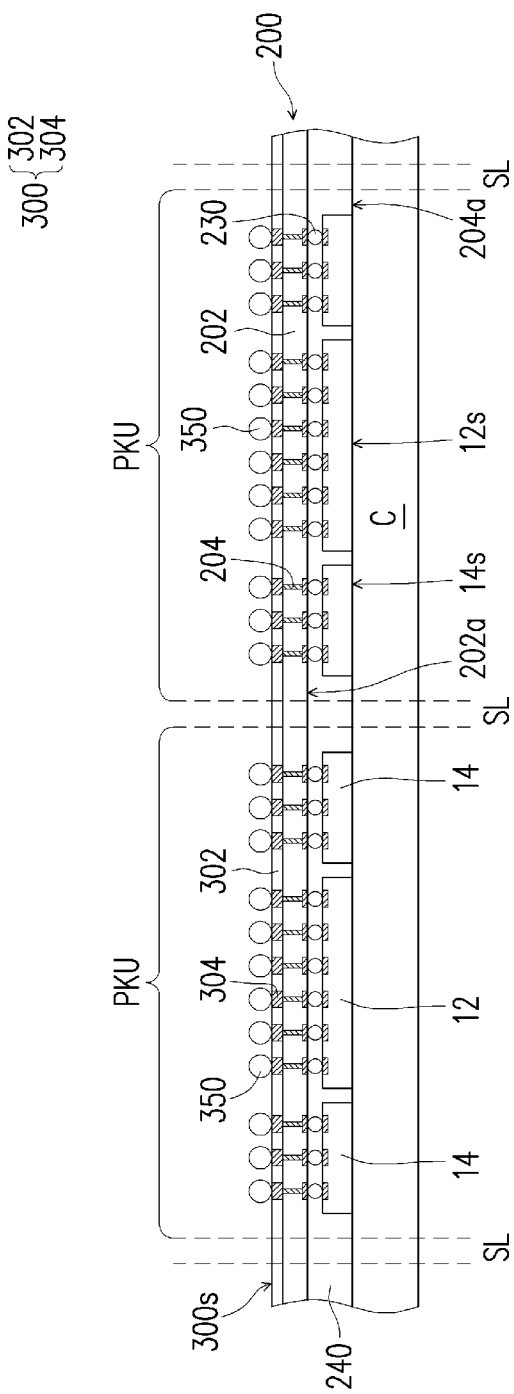

In FIG. 6, electrical connectors 350 are disposed on the metallization patterns 304 and are electrically coupled to the through vias 204. In some embodiments, the electrical connectors 350 are placed on the top surface 300s of the redistribution structure 300 and positioned on the metallization patterns 304. In some embodiments, the electrical connectors 350 include lead-free solder balls, solder balls, ball grid array (BGA) balls, bumps, C4 bumps or micro bumps. In some embodiments, the electrical connectors 350 may include a conductive material such as solder, copper, aluminum, gold, nickel, silver, palladium, tin, or a combination thereof. In some embodiments, the electrical connectors 350 are formed by forming the solder paste on the redistribution structure 300 by, for example, evaporation, electroplating, printing or solder transfer and then reflowed into the desired bump shapes. In some embodiments, the electrical connectors 350 are placed on the redistribution structure 300 by ball placement or the like. In other embodiments, the electrical connectors 350 are formed by forming solder-free metal pillars (such as a copper pillar) by sputtering, printing, electroless or electro plating or CVD, and then forming a lead-free cap layer by plating on the metal pillars.

The electrical connectors 350 may be used to bond to an external device or an additional electrical component. In some embodiments, the electrical connectors 350 are used to bond to a circuit substrate, a semiconductor substrate or a packaging substrate.

Figure 7:
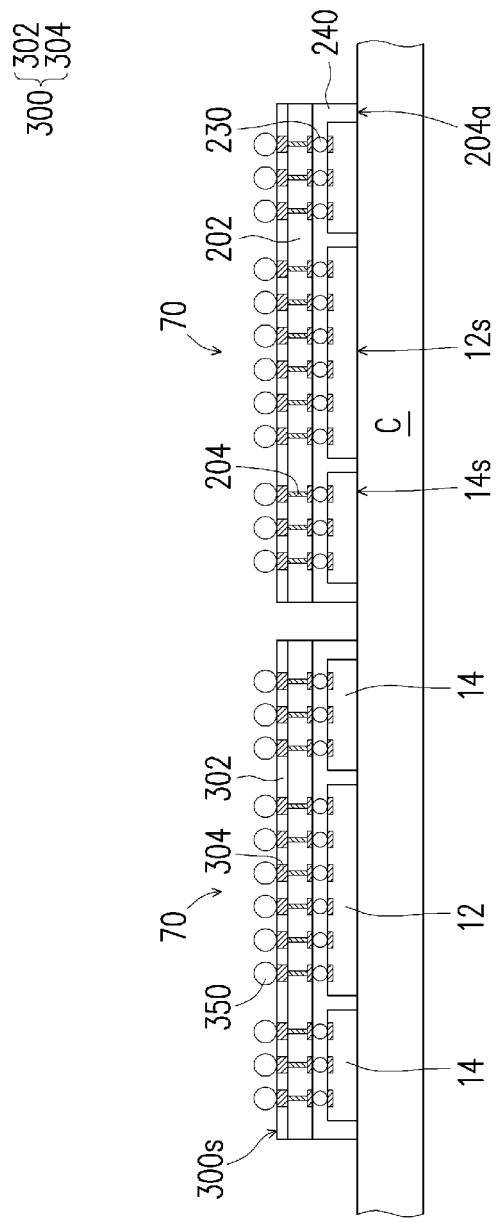

In FIG. 7, a singulation process is performed to cut the package structure of FIG. 6 along the scribe lanes SL around the package units PKU into a plurality of packages 70. Each package 70 includes at least one first die 12, more than one second dies 14, encapsulant 240 surrounding the first and second dies 12, 14, conductive joints 230, through vias 204, the redistribution structure 300 including the dielectric layer 302 and the metallization patterns 304 (the cut redistribution structure referred also as the redistribution structure in FIG. 7) and electrical connectors 350 disposed on the surface 300s of the redistribution structure 300. In some embodiments, the singulation process may include a sawing process or a dicing process.

After the singulation process, the packages 70 are detached from the carrier C and the carrier C is removed. In the subsequent process(es), the packages 70 may be flipped and further mounted on a circuit substrate or a packaging substrate.

Figure 8:
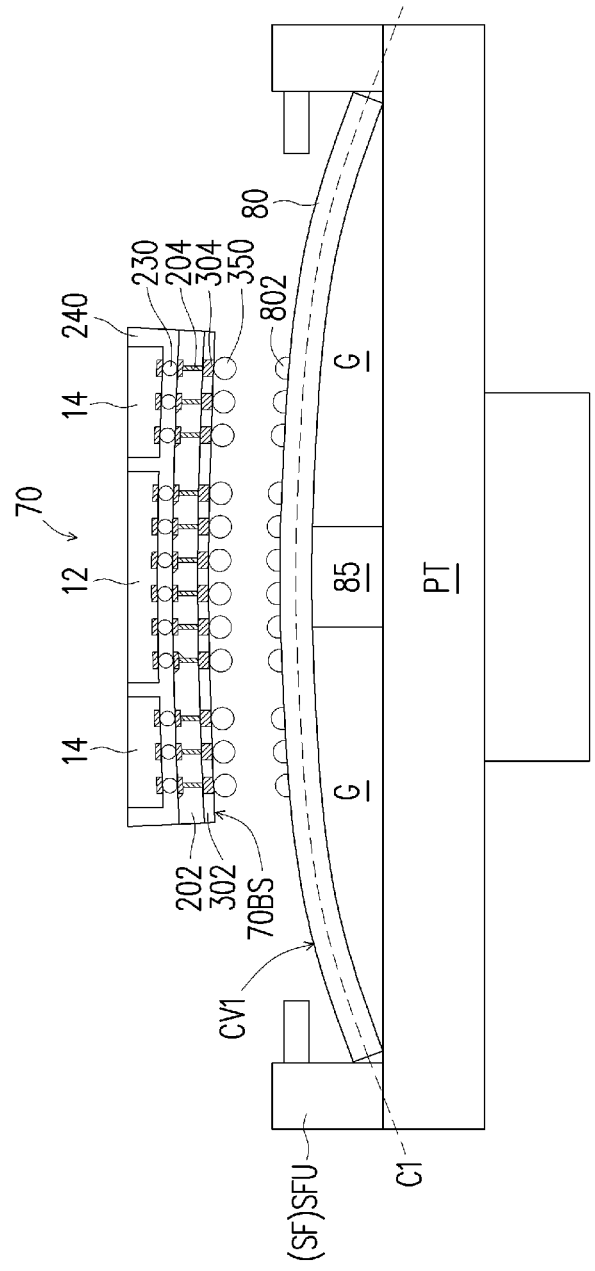
Figure 16:
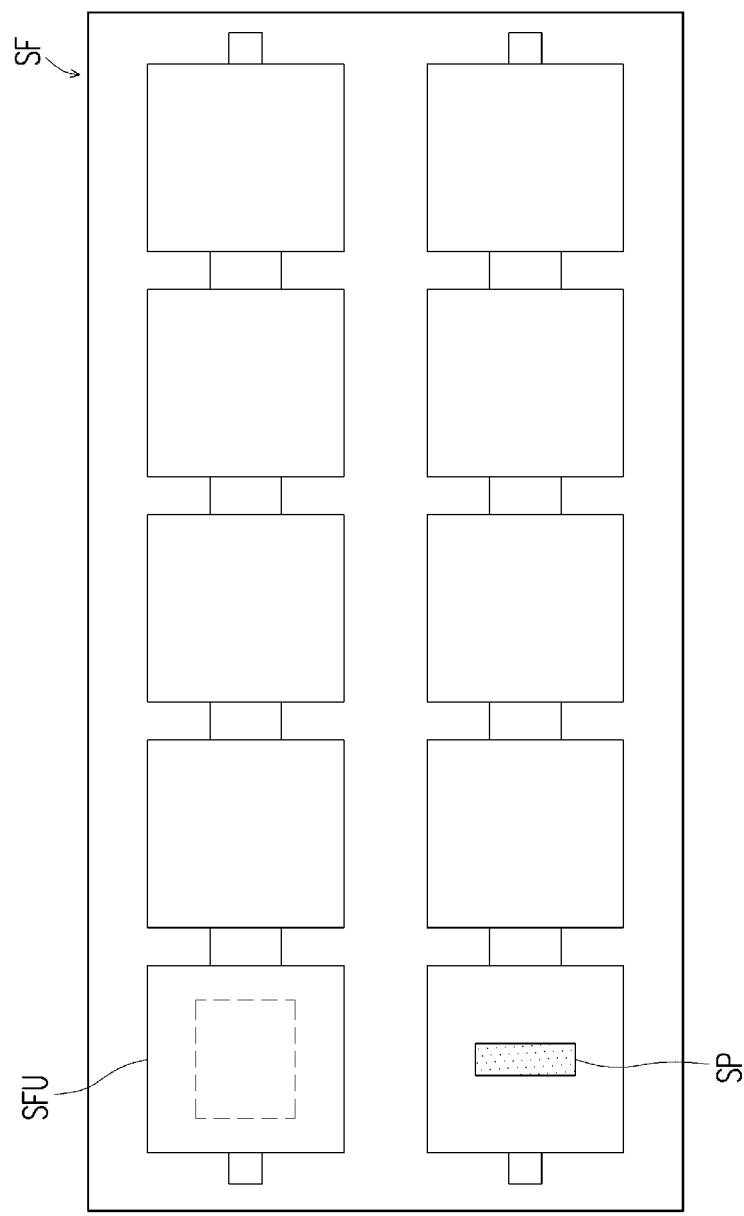
FIG. 16 is a schematic top view illustrating a substrate fixture in accordance with an embodiment of the present disclosure.

In FIG. 8, a circuit substrate 80 having mounting portions 802 thereon is provided to a substrate fixture SF mounted on a platform PT. In some embodiments, the substrate fixture SF may be a plate fixture (as seen in FIG. 16) having more than one fixture units SFU. In some embodiments, the circuit substrate 80 may be placed onto the substrate fixture SF and fitted into one fixture unit SFU. In some embodiments the circuit substrate 80 may include a build-up substrate, a laminate substrate, a circuit board such as a printed circuit board (PCB), or the like. In some embodiments, the mounting portion 802 may include pre-solder formed on pads of the circuit substrate. In addition, the circuit substrate 80 may further comprise electrical contacts or other electric components therein. In addition, at least one package 70 is provided. In FIG. 8, the package 70 is provided with its bottom surface 70BS facing the circuit substrate 80. In FIG. 8, although one package 70 and one circuit substrate 80 are shown, multiple packages and multiple circuit substrates may be used. In some embodiments, the package 70 (and the dies 12, 14) may become slightly warped before the reflow process, but the warpage degree of the package 70 as shown in FIG. 8 (i.e. before the reflow process) is smaller than, the warpage degree of the package 70 when undergoing the reflow process (see FIG. 9). In some embodiments, before disposing the package 70 onto the circuit substrate 80 and before placing the circuit substrate 80 onto the substrate fixture SF, a substrate padding process is performed to adjust the geometric shape, topological profile or curvature of the circuit substrate 80. During the substrate padding process, one or more spacers 85 may be placed on the fixture unit SFU of the substrate fixture SF. After placing the circuit substrate 80 onto the substrate fixture SF, the spacer 85 is located underneath the circuit substrate 80 and between the circuit substrate 80 and the substrate fixture SF so as to create at least a space or a gap G between the circuit substrate 80 and the substrate fixture SF. In some other embodiments, the spacer(s) 85 may be inserted between the circuit substrate 80 and the substrate fixture SF after placing the circuit substrate 80 onto the substrate fixture SF. Through performing the substrate padding process, the spacer 85 raises the vertical positions of specific portions of the circuit substrate 80 and changes the substantially flat circuit substrate (substantially planar or flat in relation to the mounting surface of the platform PT) into a curving circuit substrate 80. That is, the circuit substrate 80 is a warped circuit substrate. In some embodiments, the warped circuit substrate has a curved surface CV1 and the mounting portions on the curved surface CV1 are arranged along the curved surface CV1. From the cross-sectional view (cross-section taken as the normal plane cut through the curved surface) of FIG. 8, a curve C1 (shown as the dotted line) of the curved surface CV1 is seen and the curvature of such curve of the curved surface CV1 may be expressed as the radius of the curvature. In some embodiments, the curved surface CV1 (i.e. the bending part or the warpage of the circuit substrate 80) may be expressed as combinations of curvatures from normal sections. In some embodiments, the curved surface CV1 (the warpage) of the warped circuit substrate 80 is expressed as the deviated distance measuring from the distorted plane relative to the base plane (the mounting plane of SFU). In FIG. 8, the spacer 85 is arranged at a central position of the fixture unit SFU and the circuit substrate 80 is bowed and becomes convex (so called crying-shape) through the padding the spacer 85. In one embodiment, as one circuit substrate is fitted to one fixture unit, the spacer arrange at a central position of the fixture unit is also located at a central position of the circuit substrate.

Figure 9:
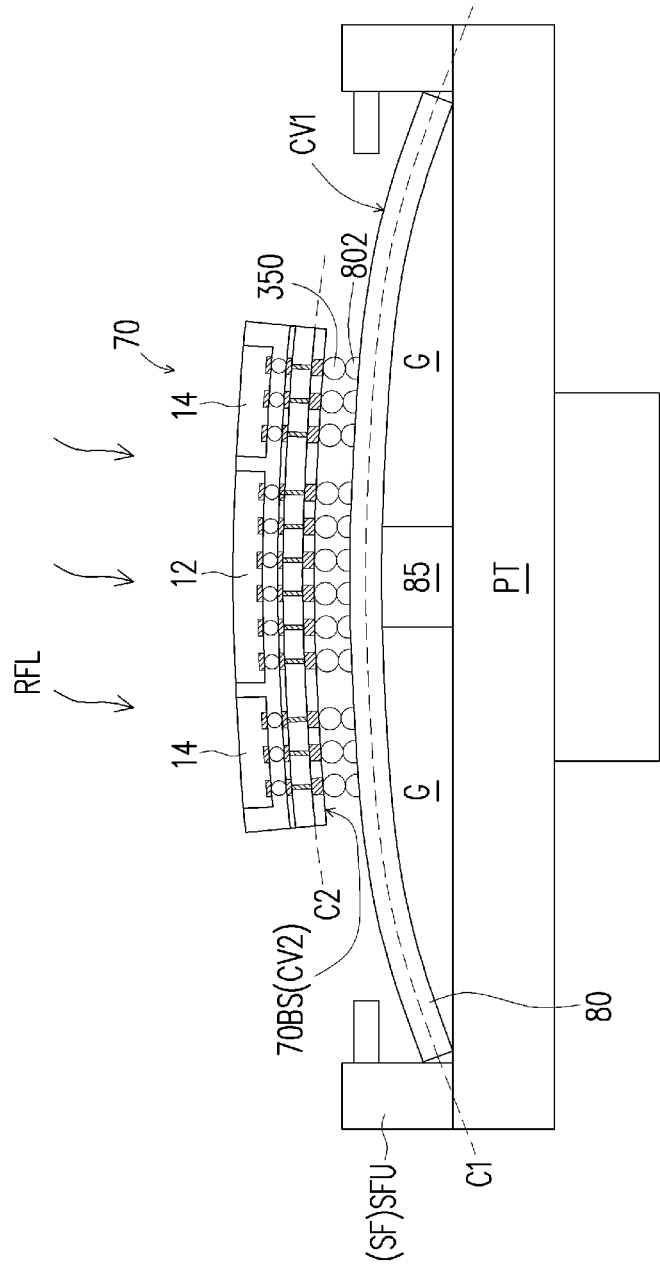

In FIG. 9, the package 70 is placed on the circuit substrate 80 and a reflow process RFL is performed. In some embodiments, the package 70 is picked and placed over a top surface of the circuit substrate 80 and the electrical connectors 350 on the bottom surface 70BS of the package 70 are aligned to and disposed on the mounting portions 802 of the circuit substrate 80. The reflow process is performed as part of the bonding process for the package 70 and the circuit substrate 80 to bond the electrical connectors 350 to the mounting portions 802. In some embodiments, the reflow process includes performing a thermal heating process at a reflow temperature to electrical connectors 350 and the mounting portions 802, so that the electrical connectors 350 turns into a melted state or a semi-melted state to integrate and bond with the mounting portions 802 of the circuit substrate 80. The reflow temperature of the electrical connectors 350 is required to be higher than a melting point of the electrical connectors 350. In one embodiment, the electrical connectors are C4 bumps, the reflow temperature ranges from 210 Celsius degrees to 250 Celsius degrees. In one embodiment, the electrical connectors are solder balls or lead-free solder balls, the reflow temperature ranges from 200 Celsius degrees to 260 Celsius degrees.

In some embodiments, the package 70 has the first die 12 and the second dies 14 around the first die 12. During the reflow process, under the thermal impact, the package 70 (and the dies 12, 14) becomes warped owing to the CTE mismatch and the warpage of the package 70 coincides with the pre-arranged warpage of the circuit substrate 80. In some embodiments, the geometric shape of the warped package 70 corresponds and conforms to that of the warped circuit substrate 80. In some embodiments, the package 70 is bowed and becomes convex (crying-shape). In some embodiments, as the package 70 becomes warped, the bottom surface 70BS of the package 70 having the electrical connectors thereon becomes a curved surface CV2 and the electrical connectors 350 are arranged along the curved surface CV2. From the cross-sectional view (cross-section taken as the normal plane cut through the curved surface) of FIG. 9, a curve C2 (shown as the dotted line) of the curved surface CV2 is seen and the curvature of such curve of the curved surface CV1 may be expressed as the radius of the curvature. In some embodiments, the curvatures of the curve C1 and the curve C2 are substantially the same, and the curve C1 and the curve C2 are the same type of curves in parallel. In some embodiments, the curved surface CV1 is parallel to the curved surface CV2. That is, the curve surface CV1 of the circuit substrate 80 and the curved surface CV2 of the package 70 are in parallel to each other and are spaced apart with a constant spacing (distance) there-between. Accordingly, the electrical connectors 350 can be accurately aligned to and bonded with the corresponding mounting portions 802. After the bonding process, intermetallic compounds (not shown) may be form in the joints 380.

In some embodiments, the spacer 85 located on the fixture unit SFU is located beneath the circuit substrate 80 at a position corresponding to a position of the first die 12 of the package 70. In one embodiment, along the vertical direction (upright direction in FIG. 9) the location of the spacer is right below the location of the first die 12.

Through the pre-arranged warped circuit substrate that is bent or bowed by the spacer 85 placed underneath, the electrical connectors 350 of the package 70 are fully in contact with the mounting portions 802 of the circuit substrate 80 during reflowing, and the issues of cold joints or bump bridging may be significantly resolved. Accordingly, the connection reliability of the joints is greatly improved and the production yield is much increased.

Compared with the yield of the package assembly produced without performing the substrate padding process (without using the spacer during reflowing), the yield of the package assembly produced using the substrate padding process is much boosted, with a pass rate of the reliability qualification reaching 90% or even 99%.

Figure 10:
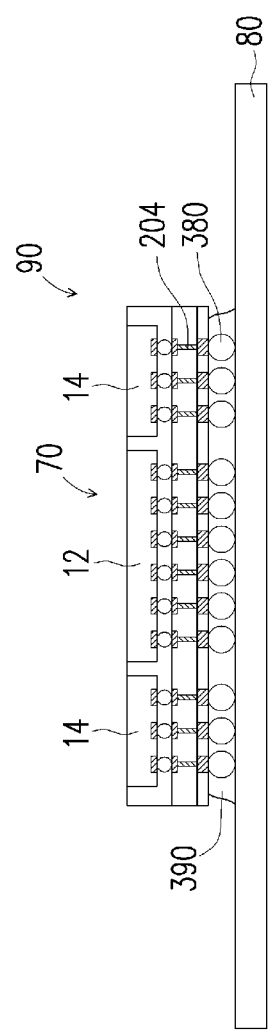

In FIG. 10, after the reflow process, joints 380 are formed between the package 70 and the circuit substrate 80. The electrical connectors 350 and the corresponding mounting portions 802 are reflowed (FIG. 9) and bonded together to form the joints 380. In some embodiments, the joints 380 are physically connects with the package 70 and the circuit substrate 80 and electrically connects the package 70 with the circuit substrate 80. The plate fixture SF and the spacer (s) 85 placed thereon are detached and removed after the reflow process. In some embodiments, the assembled structure 90, including the circuit substrate 80, the package 70 connected with the circuit substrate 80 and the joints 380 located there-between, is a substantially flat or planar structure. That is, without the thermal stress caused by the reflow process and without the existence of the spacer(s) 85, the package 70 and the circuit substrate 80 are not warped and the stably jointed assembled structure 90 turns out to be a warpage-free or a substantially planar structure. An underfill process may be performed to dispense an underfill material 390 between the package 70 and the circuit substrate 80 and surrounding the joints 380. The underfill material may be a polymer, an epoxy material, a molding underfill, or the like.

In the embodiments, through performing the substrate padding process, the complicated issues of thermal stress induced warpages have been eased to a great extent and the connection reliability of the joints is significantly improved. Hence, the production yield and the production efficiency are increased. The spacer(s) used in the padding process is eventually removed and may be re-used or recycled. As the padding process is compatible with the existing manufacturing process, little or no extra equipment is need.

Figure 11:
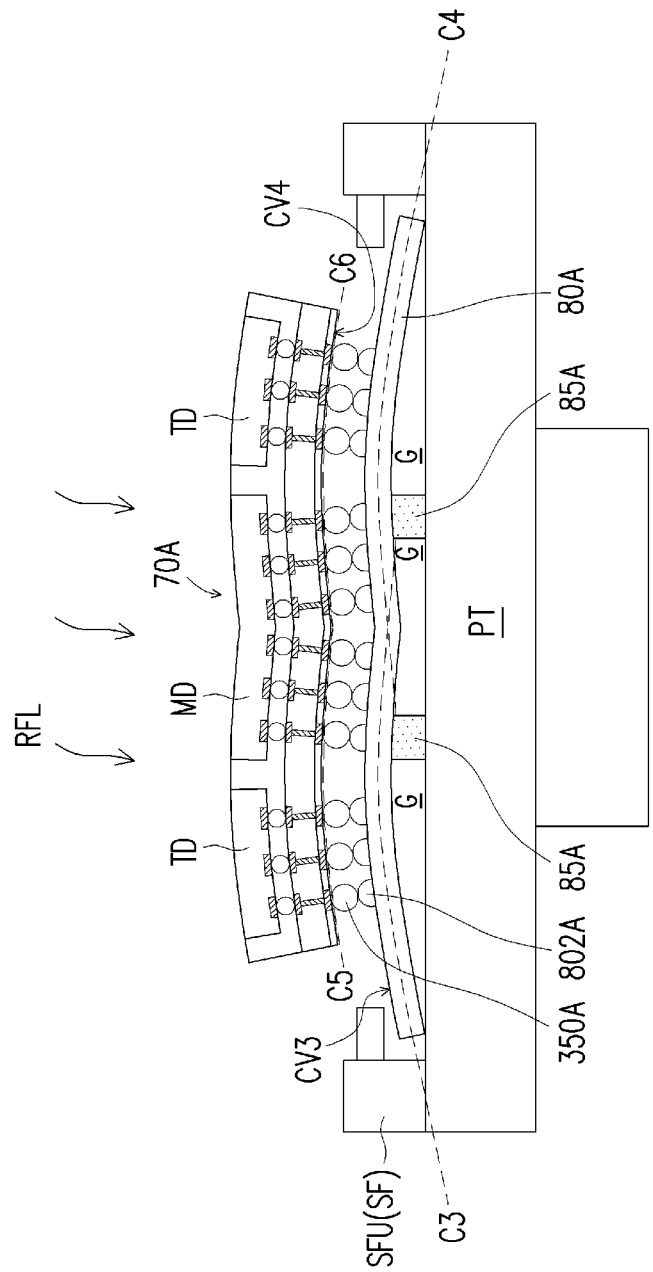
FIG. 11 is a schematic cross-sectional view illustrating a package and a circuit substrate provided onto a platform and being reflowed in accordance with an embodiment of the present disclosure.

FIG. 11 is a schematic cross-sectional view illustrating a package and a circuit substrate provided onto a platform and being reflowed in accordance with an embodiment of the present disclosure.

In FIG. 11, two spacers 85A are arranged on the fixture unit SFU of the substrate fixture SF through the substrate padding process. After placing the circuit substrate 80A onto the substrate fixture SF, the spacers 85A are located underneath the circuit substrate 80A and between the circuit substrate 80A and the substrate fixture unit SFU, creating gaps G between the circuit substrate 80A and the substrate fixture unit SFU. The spacer 85A raises the vertical positions of specific portions of the circuit substrate 80A. In some embodiments, the warped circuit substrate 80A has a deformed surface CV3. In some embodiments, the warpage of the circuit substrate 80A may be expressed as the deviated distance measuring from the deformed surface relative to the base plane (the mounting plane of SFU. In certain embodiments, from the cross-sectional view of FIG. 11 (cross-section taken as the normal plane cut through the deformed surface CV3), at least two curves C3, C4 (shown as the dotted lines) of the deformed surface CV3 are shown and the curvatures of these curves C3, C4 may be expressed as the radius of the curvature. In FIG. 11, the two spacers 85A are arranged below the major die MD of the package 70A and beneath both sides of the major die MD and the circuit substrate 80 is bowed and warped with a M shape through the padding the spacer 85A. In certain embodiments, along the upright direction (thickness direction) in FIG. 11, the locations of the two spacers 85A are located right below the location of the major die MD and the outer sides of the two spacers 85A substantially align with the two opposite sides of the major die MD. That is, the underneath spacers 85A are located within the span of the major die MD of the package 70A.

In some embodiments, the spacer(s) may be arranged beneath the location or the span of the major die of the package. In alternative embodiments, the spacer(s) may be arranged beneath the location or the span of the tributary die(s) of the package. Depending on the warpage behavior of the above package during the bonding process of the joints, the spacer(s) arranged under the circuit substrate may be adjusted accordingly so as to ensure the warpage level of the circuit substrate corresponds to the warpage level of the package.

In FIG. 11, the package 70A is placed on the circuit substrate 80A and a reflow process RFL is performed. In some embodiments, the package 70A is a CoWoS package having a major die MD larger in size and several small tributary dies TD arranged around the major die MD. During the reflow process, under the thermal impact, the package 70A becomes warped owing to the CTE mismatch and the warpage of the package 70A matches and agrees with the pre-arranged warpage of the circuit substrate 80. In one embodiment, the package 70A is a warped structure with an M-shaped cross section (M-shaped structure) with a deformed surface CV4. In some embodiments, the geometric shape of the warped package 70A corresponds and conforms to that of the warped circuit substrate 80A. From the cross-sectional view of FIG. 11 (cross-section taken as the normal plane cut through the deformed surface CV4), at least two curves C5, C6 (shown as the dotted lines) of the deformed surface CV4 are shown and the curvatures of these curves of the deformed surface CV4 may be expressed as the radius of the curvature. In some embodiments, the curvatures of the curve C3 and the curve C5 are substantially the same, and the curve C3 and the curve C5 are the same type of curves in parallel. In some embodiments, the curvatures of the curve C4 and the curve C6 are substantially the same, and the curve C4 and the curve C6 are the same type of curves in parallel. In some embodiments, the deformed surface CV3 of the circuit substrate 80A and the deformed surface CV4 of the package 70A are conformal to each other, substantially in parallel and spaced apart with a constant spacing there-between. Accordingly, the electrical connectors 350A can be accurately aligned to and bonded with the corresponding mounting portions 802A.

In the embodiments, the deformed surface may include one or more curved surfaces, planar surfaces and/or the combinations thereof. In certain embodiments, the curved surface may include an elliptic paraboloid, a parabolic cylinder, a hyperbolic paraboloid or combinations thereof.

Figure 17:
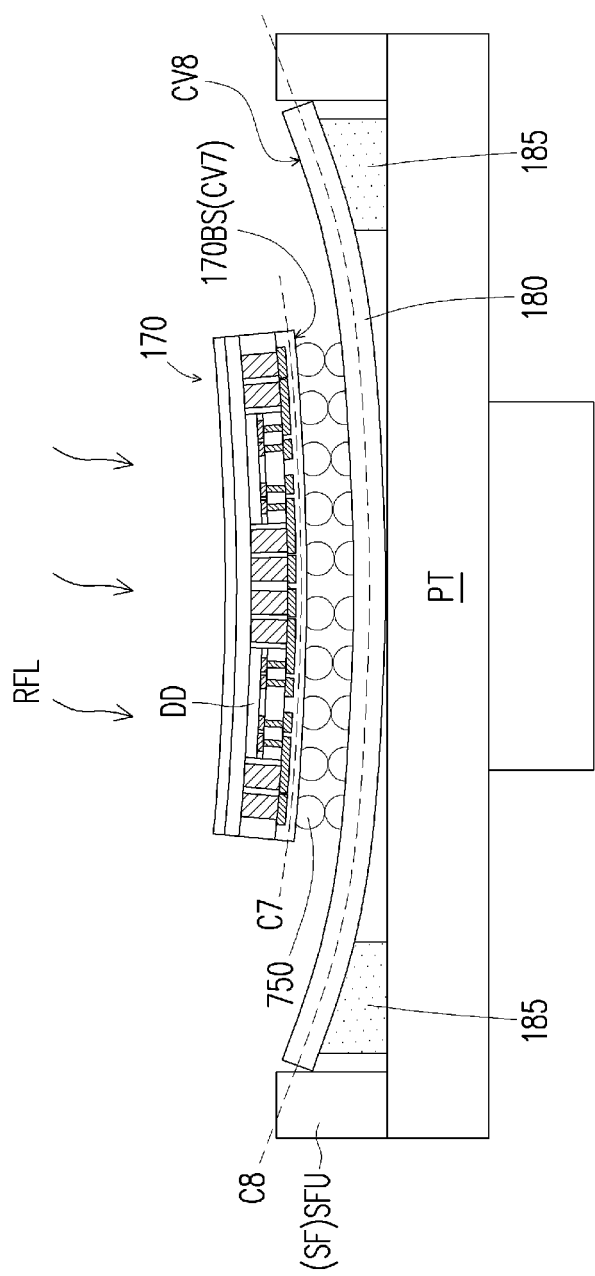
FIG. 17 is a schematic cross-sectional view illustrating a package and a circuit substrate provided onto a platform and being reflowed in accordance with an embodiment of the present disclosure.

FIG. 17 is a schematic cross-sectional view illustrating a package and a circuit substrate provided onto a platform and being reflowed in accordance with an embodiment of the present disclosure.

In FIG. 17, the package 170 is placed on the pre-arranged warped circuit substrate 180 and a reflow process RFL is performed. In some embodiments, the package 170 is an InFO package having one or more dies DD. In some embodiments, the pre-arranged warped circuit substrate 180 is provided through the arrangement of spacers 185 and the substrate padding process. During the reflow process, under the thermal impact, the package 170 becomes warped owing to the CTE mismatch and the warpage of the package 170 matches and agrees with the pre-arranged warpage of the circuit substrate 180. In some embodiments, the geometric shape of the warped package 170 corresponds and conforms to that of the warped circuit substrate 180. In some embodiments, the package 170 is bowed and becomes concave (smile-shape or U-shaped). In some embodiments, as the package 170 becomes warped, the bottom surface 170BS of the package 170 having the electrical connectors 750 thereon becomes a curved surface CV7 and the electrical connectors 750 are arranged along the curved surface CV7. From the cross-sectional view (cross-section taken as the normal plane cut through the curved surface) of FIG. 17, a curve C7 (shown as the dotted line) of the curved surface CV7 is seen. In FIG. 17, the curved surface CV8 of the warped circuit substrate 180 has a curve C8. In some embodiments, the curvature of the curve may be expressed as the radius of the curvature. In some embodiments, the curvatures of the curve C7 and the curve C8 are substantially the same, and the curve C7 and the curve C8 are the same type of curves in parallel. In some embodiments, the curved surface CV7 is parallel to the curved surface CV8. That is, the curve surface CV8 of the circuit substrate 180 and the curved surface CV7 of the package 170 are in parallel to each other and are spaced apart with a constant spacing (distance) there-between. Accordingly, the electrical connectors 750 can be accurately aligned to and bonded with the corresponding mounting portions 802 of the warped circuit substrate 180.

For the substrate padding process, the spacer(s) arranged under the circuit substrate should be arranged in a way to make the warpage level of the circuit substrate correspond to the warpage level of the package during the reflow process. A warpage assessing process is used to identify the warpage level of the package structure undergoing thermal processing, for example, a reflow process, at elevated temperatures. The warpage assessing process comprises, for example, several steps as follows. The information of the surface conditions of the warped surface of the package under the elevated temperature (e.g. a reflow temperature) is measured and calculated under simulation to determine the warpage level of the package under thermal stress during reflowing. In certain embodiments, the surface conditions includes topography or surface profiles of the warped surface of the package. Experimentation may be performed instead of using simulation. Based on the determined warpage level of the package, a shape fitting step is performed to determine the suitable matching warpage level of the corresponding substrate. The shape fitting (or curve fitting) step may include numerical calculation and digital image correlation. The determined matching warpage level of the circuit substrate may be used as the pre-arranged warpage (level) of the circuit substrate. In theory, the pre-arranged warpage level is substantially in conformity with real warpage level of the package under the elevated temperature. That is, the surface profiles or geometric shapes of the warped surface of the substrate match with those of the warped surface of the package under the elevated temperature. Subsequently, based on the determined warpage of the package, the arrangement of the spacer(s), including the layout, the number and the sizes of the spacer(s) used in the padding process is carefully designed to achieve the pre-arrange warpage of the circuit substrate.

In some embodiments, the package is a CoWoS package. Under thermal process, the warpage of the CoWoS package may include convex warpage (warped part with a crying-shape cross section). In other embodiments, the package is an InFO package. Under thermal process, the warpage of the InFO package may include concave warpage (warped part with a smile-shape cross section). Depending on the type(s) and the design(s) of the package(s) mounted on the circuit substrate, the warpage level or the warpage of the circuit substrate may be tuned to include convex warpage, concave warpage or even combinations thereof.

FIG. 12-15 are schematic views illustrating the locations and sizes of the spacers in accordance with an embodiment of the present disclosure.

Figures 12, 13:
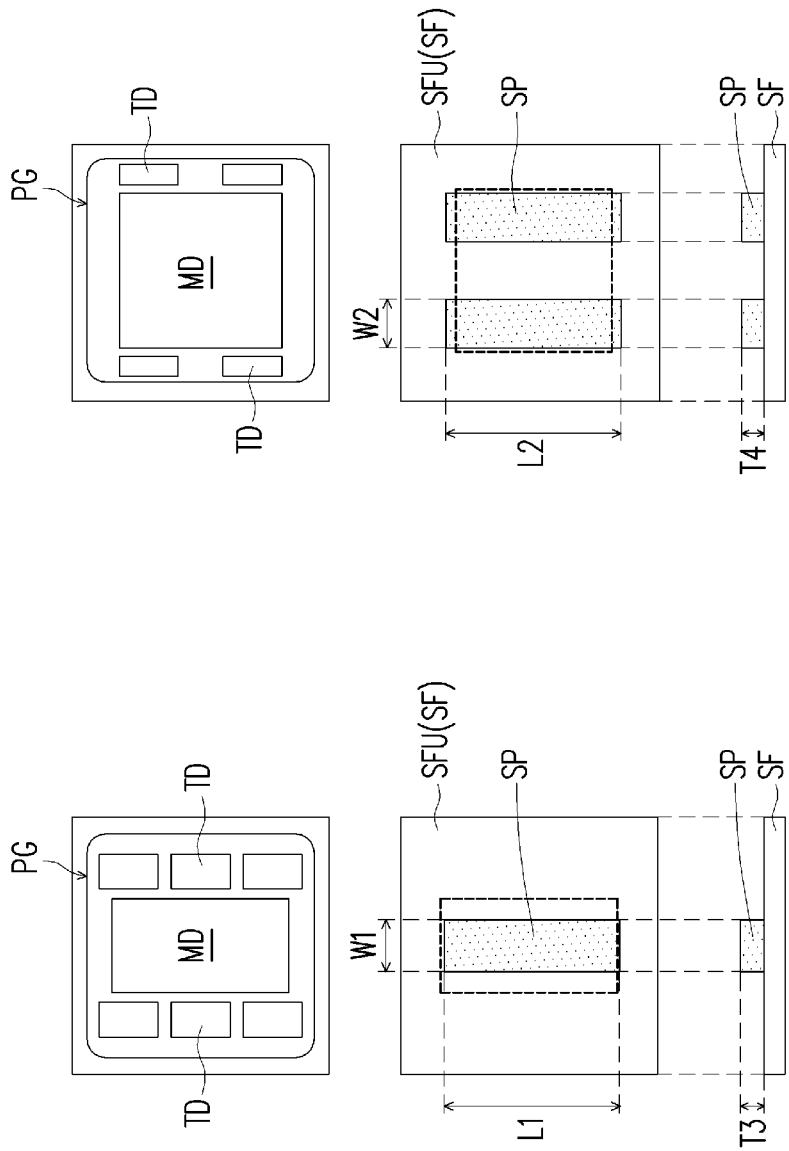
FIG. 12-15 are schematic views illustrating the locations and sizes of the spacers in accordance with some embodiments of the present disclosure.

In FIG. 12 and FIG. 13, the middle parts are the schematic top views of the spacers SP located on the substrate fixture SF, while the lower parts are the schematic cross-sectional views of the spacers SP on the substrate fixture SF. The upper parts of FIG. 12 and FIG. 13 schematically illustrate the arrangements of the major die(s) MD and tributary dies TD within the package PG.

From the middle and lower parts of FIG. 12, one spacer SP is arranged within one fixture unit SFU on the substrate fixture SF, and the spacer SP is a strip block having a length L1, a width W1 and a constant thickness T3. From the middle and lower parts of FIG. 13, two spacers SP are arranged within one fixture unit SFU on the substrate fixture SF, and each spacer SP is a strip block having a length L2, a width W2 and a constant thickness T4. In some embodiments, the spacer SP is located beneath the major die MD and the location of the spacer SP corresponds to the location of the major die MD. In some embodiments, the vertical projection (onto the based plane of SFU) of the spacer SP is partially overlapped with the vertical projection (onto the based plane of SFU) of the major die MD of the above package PG. In some embodiments, in FIG. 12, the vertical projection (onto the based plane of SFU) of the spacer SP is fully overlapped with the vertical projection (onto the based plane of SFU, shown as a dotted rectangle) of the major die MD of the above package PG. In some embodiments, in FIG. 13, the vertical projection (onto the based plane of SFU) of the spacer SP is partially overlapped with the vertical projection (onto the based plane of SFU, shown as a dotted rectangle) of the major die MD of the above package PG. In some embodiments, the material of the spacer includes a metal material such as iron, steel or aluminum or a metallic material such as tungsten carbide. In some embodiments, the material of the spacer includes a polymeric material such as polyimide, polytetrafluoroethylene, epoxy resins or the like.

Figure 15:
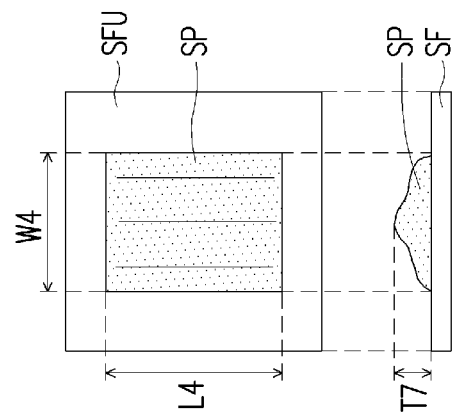
Figure 14:
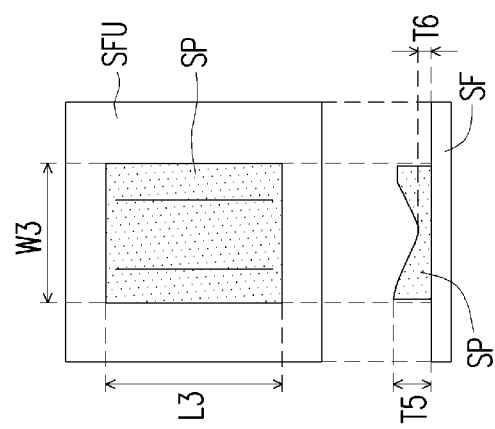

In FIG. 14 and FIG. 15, the upper parts are the schematic top views of the spacers SP located on the substrate fixture SF, while the lower parts are the schematic cross-sectional views of the spacers SP on the substrate fixture SF. The spacer shown in FIG. 14 or FIG. 15 has a thicknesses varying along different directions. In FIG. 14, one spacer SP is arranged within one fixture unit SFU on the substrate fixture SF, and the spacer SP is a rectangular block has a length L3, a width W3 and the thickness of the spacer SP is varying along the width direction with a minimum thickness T6 at the central or inner portion and a maximum thickness T5 at outer edge portions. In FIG. 15, the spacer SP is a rectangular block has a length L4, a width W4 and the thickness of the spacer SP is varying along the width direction with a maximum thickness T7 at the central or inner portion and diminishing to the minimum at outer edge portions. In some embodiments, the thickness of the spacer varies continuously along the spreading direction. In other embodiments, the thickness of the spacer varies stepwise along the spreading direction. It is understood that the thickness of the spacer may be varying along the length direction or the width direction or both. It is also understood that the dimensions, locations and the layouts of the spacer (s) may be varied for achieving the desirable surface profiles of the circuit substrate.

FIG. 16 is a schematic top view illustrating a substrate fixture in accordance with an embodiment of the present disclosure. Referring to FIG. 16, in some embodiments, the substrate fixture SF is a plate fixture having several fixture units SFU arranged in arrays. In some embodiments, the circuit substrate 80 is to be fitted to one fixture unit for substrate padding process. The size (surface area) of the fixture unit SFU is substantially equivalent to (or slightly bigger than) the size (surface area) of the circuit substrate, so as to tightly fitting the circuit substrate into the fixture unit SFU. In the bottom left fixture unit, a spacer SP is placed to show the exemplary location of the spacer within the fixture unit and relative to the subsequently placed circuit substrate thereon. In FIG. 16, the size and the location of the package (s) of the subsequently placed package is shown in the dotted line.

According to the embodiments, the packaging processes of the present application are highly compatible with the present manufacturing process. In addition, through simply performing the substrate padding process, a larger process window is allowed for the bonding process and the connection reliability of the packages is greatly improved, thus solving the issues of poor pass rates of reliability qualification and low production yields. Moreover, the package structure of the present application has reliable joint connection with higher production yield.

In accordance with some embodiments of the disclosure, a bonding process is provided. A circuit substrate is provided on a fixture, and the circuit substrate has a mounting surface and mounting portions formed on the mounting surface. A substrate padding process is performed. A package is mounted onto the mounting surface of the circuit substrate. The package has a bottom surface and connectors formed on the bottom surface of the package. A reflow process is performed and the connectors of the package are bonded to the mounting portions of the circuit substrate.

In accordance with some alternative embodiments of the disclosure, a packaging process includes the following steps. A package having a first die and a second die is provided. A circuit substrate having a first warpage level is provided. The package is mounted onto the circuit substrate and then heated under an elevated temperature to bond the package to the circuit substrate. The package heated under the elevated temperature is warped with a second warpage level, and the first warpage level is substantially in conformity with the second warpage level.

In accordance with some embodiments of the disclosure, a manufacturing method includes the following steps. A fixture is provided and at least one spacer is disposed on the fixture. A circuit substrate is disposed on the at least one spacer, over the fixture and covers the at least one spacer. The circuit substrate has a mounting surface and mounting portions formed on the mounting surface, and the mounting surface includes a curved surface. A package is mounted onto the mounting surface of the circuit substrate. The package has a lower surface and connectors formed on the lower surface of the package. A reflow process is performed and the connectors of the package are bonded to the mounting portions of the circuit substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bonding process, comprising:
    providing a circuit substrate on a fixture, wherein the circuit substrate has a mounting surface and mounting portions formed on the mounting surface;
    performing a substrate padding process including placing a spacer on the fixture for increasing warpage of the circuit substrate;
    mounting a package onto the mounting surface of the circuit substrate, wherein the package has a bottom surface and connectors formed on the bottom surface of the package; and
    performing a reflow process and bonding the connectors of the package to the mounting portions of the circuit substrate.

2. The process according to claim 1, wherein performing a substrate padding process includes placing the spacer on the fixture, underneath the circuit substrate and between the circuit substrate and the fixture to bend the circuit substrate and turn the mounting surface into a first warped surface.

3. The process according to claim 2, wherein the package includes at least one first die and a plurality of second dies, and placing a spacer includes placing at least one spacer beneath the circuit substrate at a position corresponding to a position of the at least one first die of the package.

4. The process according to claim 3, wherein a vertical projection of the at least one spacer is partially overlapped with a vertical projection of the at least one first die.

5. The process according to claim 3, wherein a vertical projection of the at least one spacer is fully overlapped with a vertical projection of the at least one first die.

6. The process according to claim 3, wherein the at least one first die comprises at least one logic die, and the plurality of second dies comprise memory dies.

7. The process according to claim 2, wherein placing a spacer includes inserting one spacer having a varying thickness underneath the circuit substrate and at a central position of the fixture to uplift portions of the circuit substrate.

8. The process according to claim 2, wherein performing the reflow process turns the bottom surface of the package into a second warped surface, and the first warped surface and the second warped surface are substantially in parallel to each other and spaced apart with a constant distance with the connectors and the mounting portions located in-between.

9. The process according to claim 1, wherein performing the reflow process after performing the substrate padding process turns the bottom surface of the package and the mounting surface of the circuit substrate substantially in parallel to each other and spaced apart with a constant distance with the connectors and the mounting portions located in-between.

10. The process according to claim 2, further comprising removing the fixture and the spacer after bonding the connectors of the package to the mounting portions of the circuit substrate.

11. A process, comprising:
    providing a package having a first die and a second die, wherein the first and second dies are different types of dies;
    performing a warpage assessing process;
    providing a circuit substrate having a first warpage level includes providing the circuit substrate to a fixture and inserting a spacer on the fixture for increasing warpage of the circuit substrate;
    mounting the package onto the circuit substrate; and
    heating the package under the elevated temperature and bonding the package to the circuit substrate under the elevated temperature, wherein the package heated under the elevated temperature is warped with a second warpage level, and the first warpage level is substantially in conformity with the second warpage level.

12. The process according to claim 11, wherein performing a warpage assessing process includes performing simulation of the package under an elevated temperature to measure and calculate surface conditions of a warped surface of the package facing the circuit substrate to determine a third warpage level of the package under the elevated temperature, the third warpage level is substantially in conformity with the first or second warpage level.

13. The process according to claim 12, wherein the surface conditions comprise topography of the warped surface of the package.

14. The process according to claim 11, wherein the spacer is inserted between the circuit substrate and the fixture and beneath the circuit substrate to form a first warped surface of the circuit substrate for mounting the package.

15. The process according to claim 14, wherein the package heated under the elevated temperature is warped to form a second warp surface facing the circuit substrate, a geometric shape of the second warped surface of the package is substantially the same as a geometric shape of the first warped surface of the circuit substrate.

16. A method, comprising:
    providing a fixture;
    disposing at least one spacer on the fixture;
    disposing a circuit substrate on the at least one spacer, over the fixture and covering the at least one spacer for increasing warpage of the circuit substrate, wherein the circuit substrate has a mounting surface and mounting portions formed on the mounting surface, and the mounting surface includes a curved surface;

mounting a package onto the mounting surface of the circuit substrate, wherein the package has a lower surface and connectors formed on the lower surface of the package; and performing a reflow process and bonding the connectors of the package to the mounting portions of the circuit substrate.

17. The method according to claim 16, wherein the package includes at least one first die and a plurality of second dies, and disposing the at least one spacer includes placing the at least one spacer on the fixture at a position corresponding to a position of the at least one first die of the package after mounting the package.

18. The method according to claim 17, wherein a vertical projection of the at least one spacer is partially overlapped with a vertical projection of the at least one first die.

19. The method according to claim 17, wherein a vertical projection of the at least one spacer is fully overlapped with a vertical projection of the at least one first die.

20. The method according to claim 16, wherein disposing the at least one spacer includes inserting at least one spacer having a varying thickness underneath the circuit substrate and at a central position of the fixture to uplift portions of the circuit substrate.

* * * * *